(12) United States Patent
Moffitt

(10) Patent No.: US 12,672,272 B1
(45) Date of Patent: Jun. 30, 2026

(54) COMPONENT VALIDATION SYSTEM AND METHOD INTEGRATED INTO A PICK AND PLACEMENT MACHINE

(71) Applicant: William Alan Moffitt, Rowlett, TX (US)

(72) Inventor: William Alan Moffitt, Rowlett, TX (US)

( * ) Notice: Subject to any disclaimer, the term of this patent is extended or adjusted under 35 U.S.C. 154(b) by 0 days.

(21) Appl. No.: 19/529,692

(22) Filed: Feb. 4, 2026

(51) Int. Cl.
| | |
|---|---|
| *H05K 13/08* | (2006.01) |
| *B25J 9/02* | (2006.01) |
| *B25J 9/16* | (2006.01) |
| *B25J 13/08* | (2006.01) |
| *B25J 15/06* | (2006.01) |
| *H05K 13/04* | (2006.01) |

(52) U.S. Cl.
CPC .......... *H05K 13/0882* (2018.08); *B25J 9/026* (2013.01); *B25J 9/161* (2013.01); *B25J 9/163* (2013.01); *B25J 9/1671* (2013.01); *B25J 9/1687* (2013.01); *B25J 13/082* (2013.01); *B25J 15/0616* (2013.01); *H05K 13/0404* (2013.01)

(58) Field of Classification Search
CPC . H05K 13/0882; H05K 13/0404; B25J 9/161; B25J 9/026; B25J 15/0616; B25J 9/1687
See application file for complete search history.

(56) References Cited

U.S. PATENT DOCUMENTS

| | | | |
|---|---|---|---|
| 8,050,789 | B2 | 11/2011 | Elhanan et al. |
| 10,089,429 | B2 | 10/2018 | Hirschman et al. |
| 2025/0068142 | A1* | 2/2025 | Melkote ............. G05B 19/4097 |

FOREIGN PATENT DOCUMENTS

CN        120916423 A  * 11/2025

OTHER PUBLICATIONS

CN 120916423A (Year: 2025).*

* cited by examiner

*Primary Examiner* — Wade Miles
*Assistant Examiner* — Mohammed Yousef Abuelhawa
(74) *Attorney, Agent, or Firm* — Dale J. Ream

(57) ABSTRACT
A hardware-integrated system and method for validating electronic component parameters in pick-and-place machines is disclosed. The system retrieves manufacturer datasheets via a network transceiver, applies a neural-network model executed on a hardware-accelerated AI engine to extract validated component height, weight, length, and width, and compares these validated parameters to a job file containing human-transcribed data. Deviations are used to automatically update the job file or notify an operator. Validated parameters are then used to generate precise motor command signals for X, Y, and Z gantries and vacuum control signals for placement nozzles, reducing placement errors such as tombstoning, misalignment, component slippage, and nozzle detachment, thereby improving manufacturing yield and productivity.

19 Claims, 7 Drawing Sheets

COMPONENT VALIDATION SYSTEM AND METHOD INTEGRATED INTO A PICK AND PLACEMENT MACHINE

FIELD OF THE INVENTION

The invention relates generally to automated electronic assembly systems and, more particularly, to a system and method for validating electronic components integrated into a pick-and-place machine. The invention further relates to hardware-implemented artificial-intelligence technology for validating electronic component parameters including height, weight, and dimensional values used to operate the motion gantries and placement mechanisms of the machine.

BACKGROUND OF THE INVENTION

Automated surface-mount technology (SMT) assembly relies extensively on robotic pick-and-place machines that retrieve electronic components from feeders and place the components onto a printed circuit board according to location data generated by a design engineer. In modern PCB design workflows, the design engineer generates an electronic schematic, which is transformed into a virtual PCB layout. When components are added to the design, the engineer may manually enter component parameters, retrieve parameters from a local component database, or use data from a third-party database. All three approaches depend on human transcription of manufacturer datasheet values into the design environment.

Human transcription introduces errors. Incorrect component parameters can propagate from design files into manufacturing job files used by the pick-and-place machine. Height and weight errors are particularly problematic. During operation, a pick-and-place machine uses X, Y, and Z motor-driven gantries to maneuver a placement nozzle that holds each component. While the X and Y positioning is determined from engineering layout data, the Z gantry relies on accurate component height to determine downward movement and deceleration before releasing the part at the PCB surface.

If an incorrect component height is used, the machine may release a part above the PCB surface, causing tombstoning, or may drive a part downward into the PCB or adjacent components, causing damage or displacement. Similarly, incorrect component weight can cause component slipping, misalignment, or detachment from the placement nozzle during high-speed movement of the gantries. Heavy components moved at excessive acceleration may fall, colliding with already-placed components and halting production.

Because existing design workflows rely on human transcription of datasheets, errors propagate into the manufacturing process. The lack of validated, machine-readable, manufacturer-derived parameters leads to yield loss and reduced throughput.

There exists a need for a hardware-integrated system and methodology that automatically retrieves official manufacturer datasheets, extracts validated component height, weight, and dimensions using AI hardware, and updates pick-and-place machine job files before manufacturing begins. The system must operate using physical hardware, including processor circuits, motion gantries, sensors, and signal-based control mechanisms, to avoid abstract implementations and to enable robust, real-time placement control.

SUMMARY OF THE INVENTION

The invention provides a hardware-implemented system and method for validating electronic component parameters used by a pick-and-place machine. The system includes a processor assembly comprising a CPU and at least one hardware-accelerated artificial-intelligence engine such as a graphics processing unit (GPU), tensor processing unit (TPU), or neural processing unit (NPU). The processor assembly retrieves manufacturer datasheets through a network transceiver and extracts validated component parameters using a neural-network model executed by the AI engine.

The validated parameters include at least component height and component weight and may further include length and width. The system compares the validated parameters against parameters stored in a machine-readable job file. When deviations exceed a threshold, the system automatically updates the job file or prompts the operator for approval.

The system uses the validated component parameters to generate motor command signals for the X, Y, and Z gantries and vacuum-control signals for the placement nozzle. By adjusting deceleration profiles and transport speeds based on validated height and validated weight, the system prevents tombstoning, misalignment, slippage, or detachment of components during placement.

The invention therefore replaces human-transcribed data with hardware-validated parameters derived directly from manufacturer datasheets, improving placement accuracy, manufacturing yield, and overall productivity.

More particularly, a graphics processing unit (GPU) is a powerful processor with thousands of small cores, originally for graphics, now essential for AI because its parallel processing architecture excels at the massive, simultaneous calculations (like matrix math) needed to train complex neural networks and run machine learning models quickly, making it vastly faster for AI tasks than a traditional CPU. Essentially, it's hardware built for crunching huge datasets in parallel, driving the AI boom by enabling faster experimentation and deployment of AI applications.

Similarly, a tensor processing unit (TPU) is a custom-designed Application-Specific Integrated Circuit (ASIC) by Google, built to dramatically speed up machine learning (ML) workloads, especially training and inference for deep neural networks, by efficiently handling large matrix calculations (tensors) crucial for AI. TPUs power many of Google's AI features, like Search and Gemini, offering high performance per watt and optimized for frameworks like TensorFlow, making complex AI models run faster and more efficiently.

Further, an AI neural processing unit (NPU) is a specialized processor for accelerating AI and machine learning tasks, handling complex parallel computations like matrix math efficiently, with lower power consumption than CPUs/GPUs, enabling faster on-device AI for features like real-time translation, image recognition, and smart assistants in modern laptops and smartphones. It offloads AI workloads, improving performance, battery life, and privacy by reducing reliance on the cloud, making devices smarter and more responsive.

It is an object of the invention to provide a hardware-integrated system for automatically retrieving electronic component datasheets and extracting validated height, weight, and dimensional parameters.

It is another object of the invention to provide a neural-network-based AI engine configured to parse structured and unstructured datasheet data and generate highly accurate component parameters.

It is a further object of the invention to integrate validated component parameters into pick-and-place machine control systems, including X, Y, and Z gantries and vacuum-controlled placement nozzles.

It is yet another object of the invention to reduce manufacturing defects caused by human transcription errors, including tombstoning, misalignment, component slippage, and nozzle detachment.

It is an additional object of the invention to provide operator feedback and optional job file updates when validated parameters deviate from the existing job file, enabling informed intervention.

It is a further object of the invention to improve throughput and yield in PCB assembly by using hardware-validated parameters to optimize gantry motion, deceleration profiles, and vacuum force for component placement.

It is yet another object of the invention that once the manufacturing data sheets have been obtained and component dimensions validated, the information may be saved, such as in a non-volatile memory associated with the customer or the respective PCB so that it can be utilized for future customers or respective jobs.

official manufacturer datasheets, extracts validated component height, weight, and dimensions using AI hardware, and updates pick-and-place machine job files before manufacturing begins.

Other objects and advantages of the present invention will become apparent from the following description taken in connection with the accompanying drawings, wherein is set forth by way of illustration and example, embodiments of this invention.

BRIEF DESCRIPTION OF THE DRAWINGS

FIG. 3b is an isolated view on an enlarged scale taken from a portion of FIG. 3a;

DETAILED DESCRIPTION OF THE INVENTION

Figure 1:
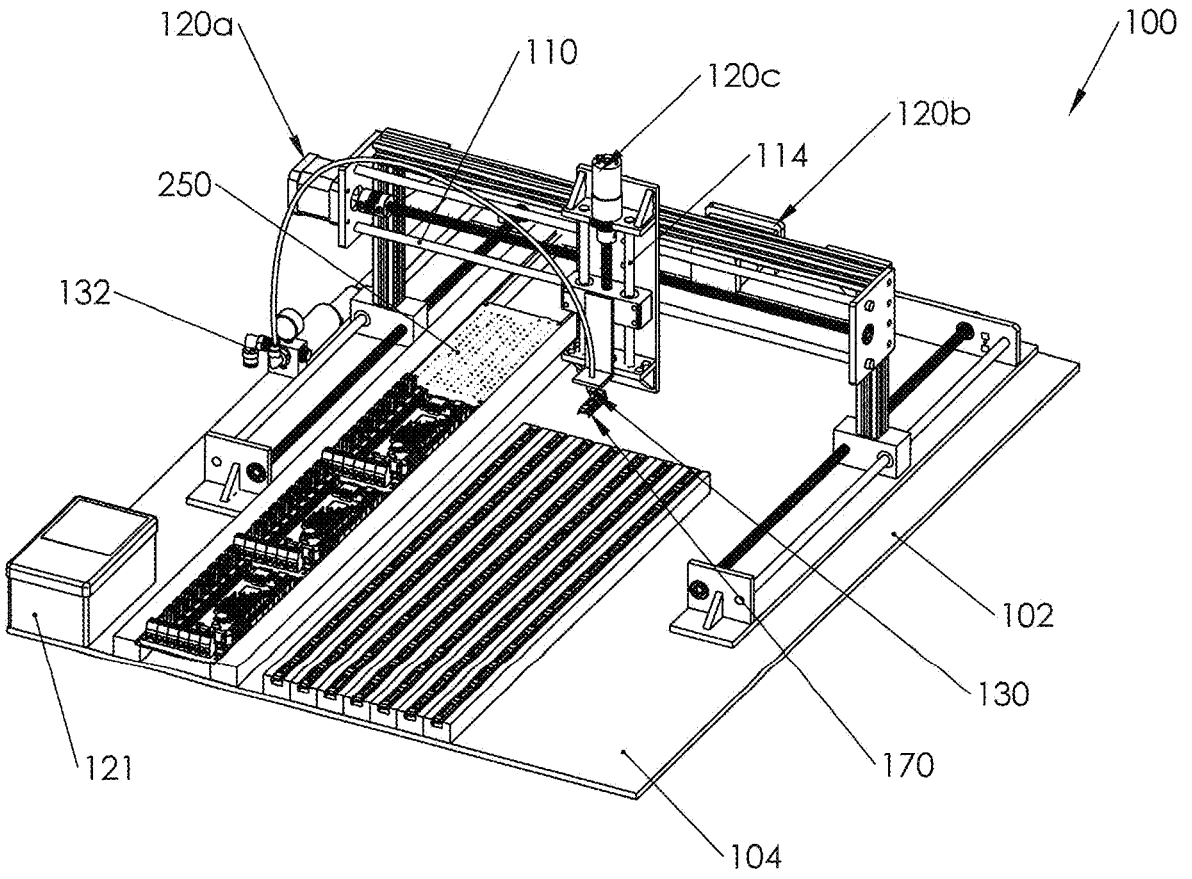
FIG. 1 is a perspective view of a component-placement validation system integrated into a pick-and-place machine according to a preferred embodiment of the present invention.

Referring now to FIG. 1, a pick-and-place machine 100 includes a rigid machine frame 102 supporting a PCB support table 104, a motion subsystem comprising an X gantry 110, a Y gantry 112, and a Z gantry 114, and a placement subsystem including a component placement nozzle 130. In a pick and place machine 100, the X, Y, and Z gantries refer to the three linear axes of motion that move a robot's end effector (like a vacuum or gripper). The X and Y gantries provide horizontal movement along a large overhead structure, allowing the robot to cover a wide work area for picking and placing parts on the PCB 250. The Z gantry provides vertical motion, moving the end effector up and down to grab objects from one level and place them on another.

Each gantry is driven by a corresponding motor (labelled as 120a, 120b, 120c and associated motor controller 122. The motor controllers are configured to output granular, time-synchronized drive signals to move each gantry along its respective axis. The system further includes a vacuum generator 132 that produces negative pressure at the placement nozzle 130 for securely holding electronic components 170, and a vacuum pressure sensor 134 that provides real-time feedback signals used by the control algorithms. It will be understood that unnumbered or miscellaneous electronic components may be positioned in the electronics box 121.

Figure 4:
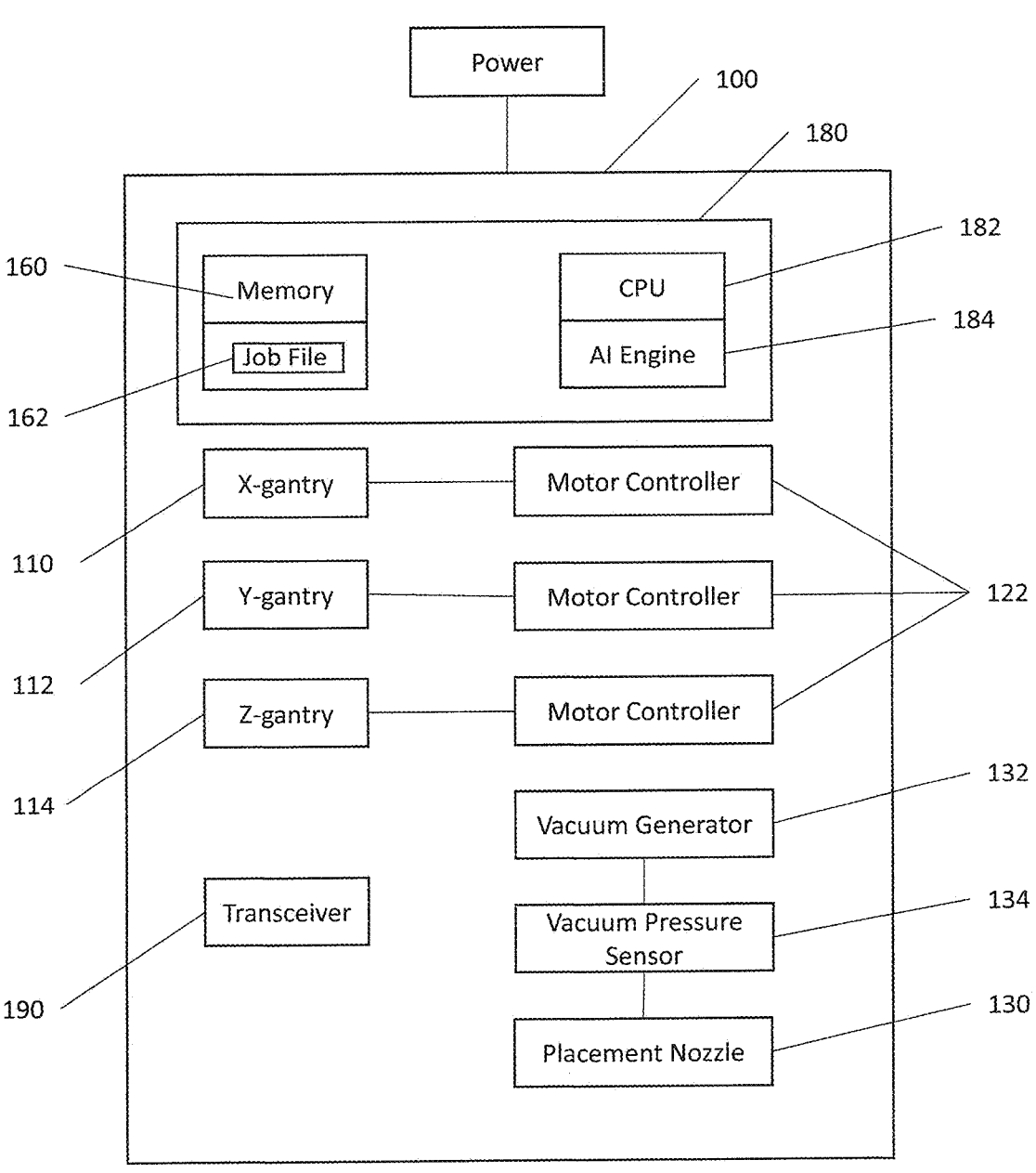
FIG. 4 is a block diagram of a system and methodology for automatically retrieving electronic component datasheets and extracting validated height, weight, and dimensional parameters according to the present invention.
Figure 5:
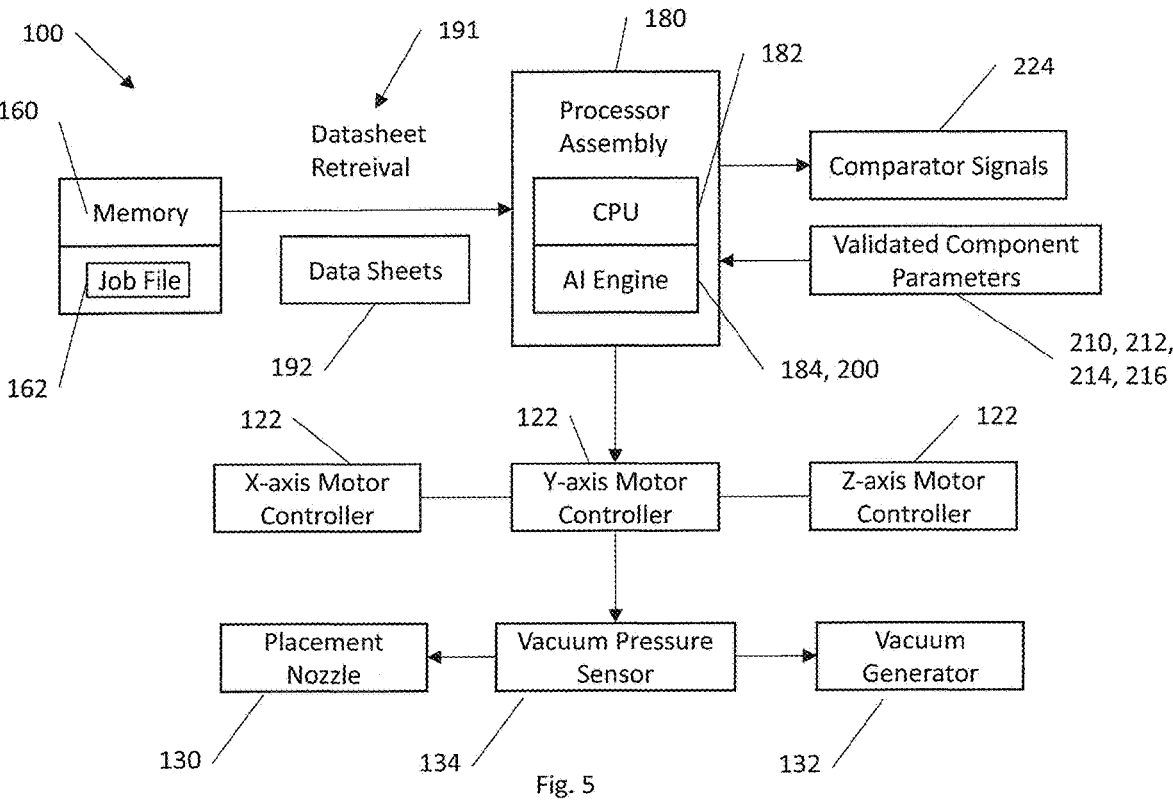
FIG. 5 is another block diagram of the system as in FIG. 4.
Figure 6:
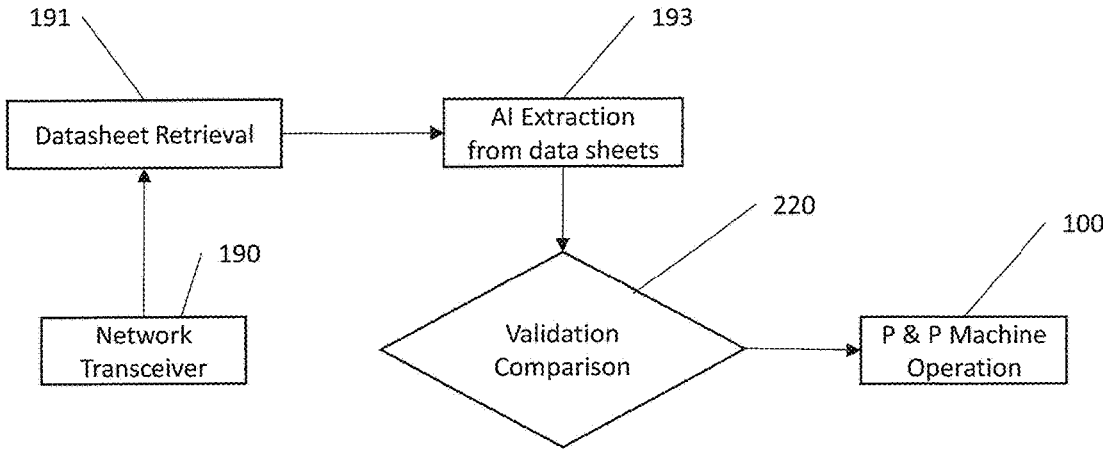
FIG. 6 is a logic diagram illustrating the methodology of datasheet retrieval, AI extraction, validation comparison, and machine-control output.
Figure 7:
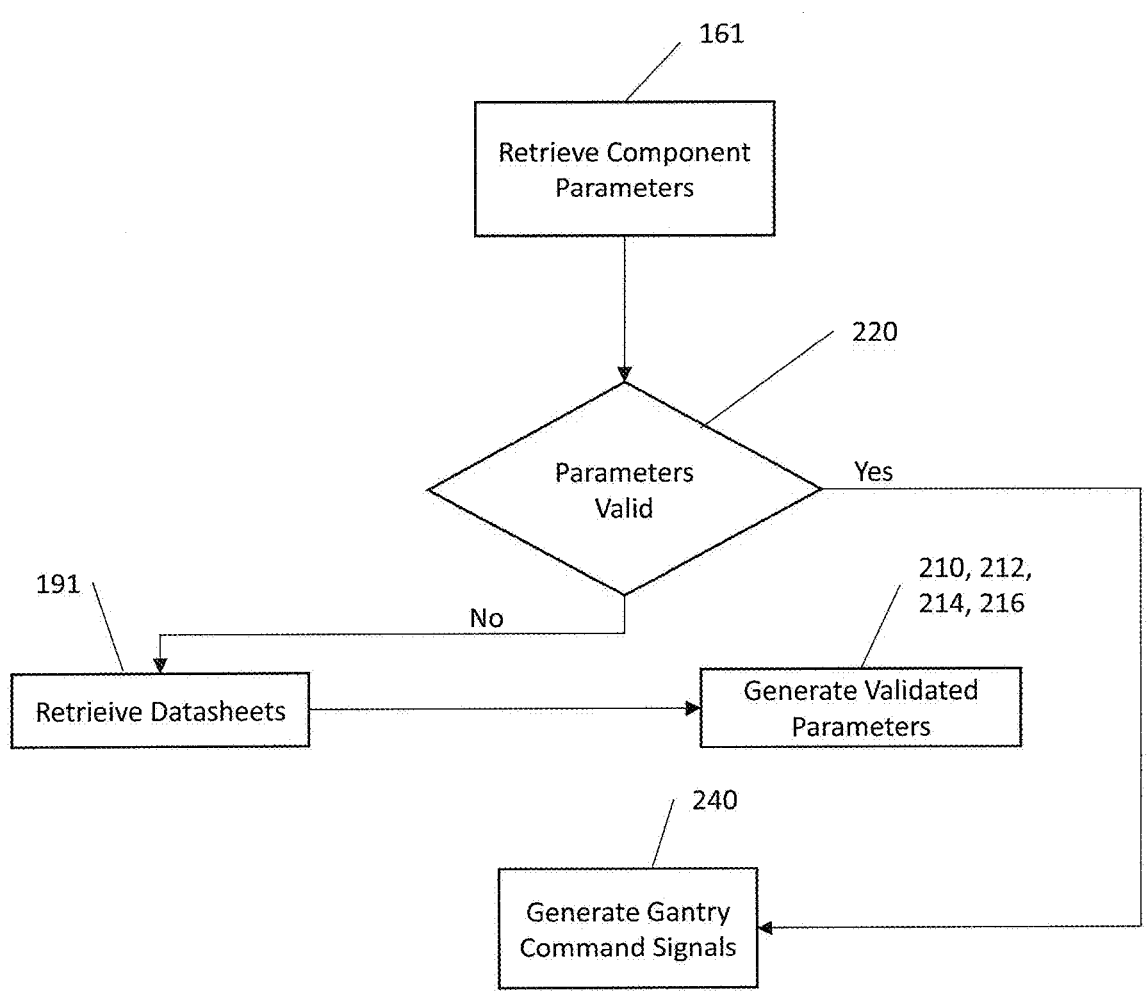
FIG. 7 is a logic diagram illustrating datasheet retrieval, validation testing, and gantry command signaling.
Figure 8:
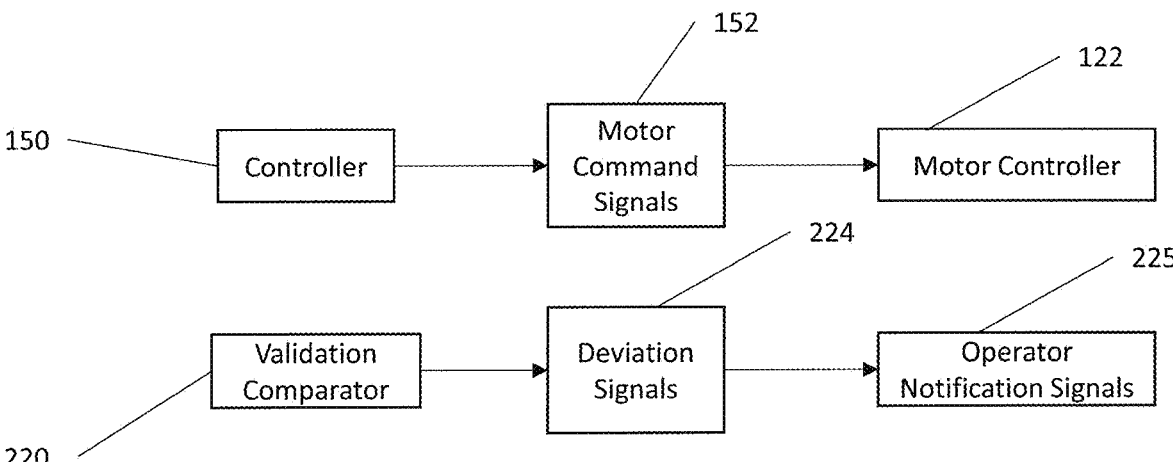
FIG. 8 is a logic diagram illustrating the invention in the context of a controller, signaling, and respective motor control.
Figure 9:
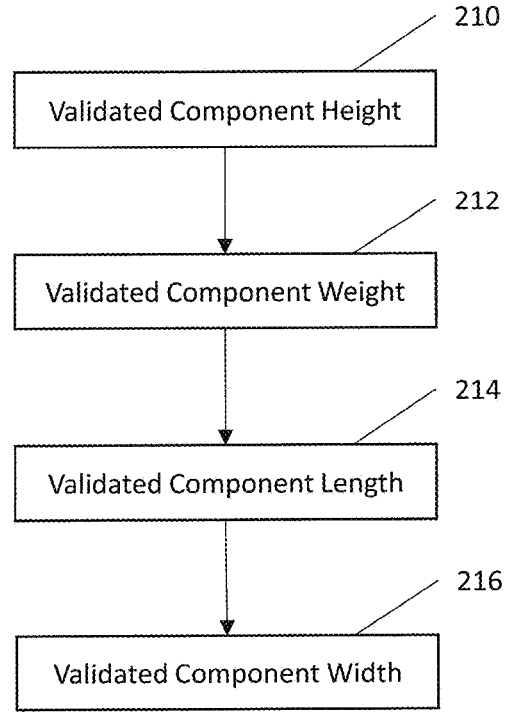
FIG. 9 is a workflow diagram regarding validation of component dimension parameters.

Referring to FIGS. 4 through 6, a system controller 150, implemented as an embedded hardware processor or programmable logic controller, provides motor command signals 152 to the motor controllers 122. A network transceiver 190 provides machine-to-machine communication capability with external datasheet repositories. A memory 160 stores a job file 162, machine-control firmware, machine-readable instructions, and data structures used for component parameter validation. A processor assembly 180 includes a CPU 182 and an AI engine 184. The AI engine may include a graphics processing unit, a tensor processing unit, a neural processing unit, a field-programmable gate array, or specialized neural-network hardware accelerators optimized for matrix operations, convolutional operations, or transformer-attention operations.

The pick-and-place system 100 is configured to use validated component parameters, including validated component height 210, validated component weight 212, validated length 214, and validated width 216, to generate precise control signals governing the placement of electronic components onto the PCB 250.

Datasheet Retrieval and Pre-Processing

Datasheet retrieval and acquisition 191 is performed via the network transceiver 190, shown in FIG. 6, which establishes HTTP, HTTPS, or MQTT-based connections to electronic component repositories such as DigiKey, OctoPart, Mouser, and SnapEDA. These repositories provide formal application-programming-interface (API) endpoints that return structured or semi-structured digital documents in PDF, JSON, XML, or image formats.

Upon receiving datasheet documents 192, the processor assembly 180 initiates a preprocessing pipeline. If the datasheet arrives in PDF format, a document decoder extracts text streams, vector graphics, embedded images, and tabular structures. If the datasheet is image-only, raster images are forwarded directly to the OCR engine 200 (an AI engine). The preprocessing pipeline generates normalized text signals, image signals, and metadata signals used downstream by the AI models.

Optical Character Recognition and Layout Analysis

The OCR engine 200, shown in FIGS. 5 and 6, performs text extraction 193 using optical-character-recognition algorithms (OCR 200) executed on the AI engine 184. The OCR engine may implement convolutional neural networks, recurrent neural networks, encoder-decoder models, or hybrid CNN-transformer architectures trained to recognize alphanumeric characters, engineering symbols, and industry-specific typography found in manufacturer datasheets.

The OCR engine identifies headers, engineering tables, footnotes, dimension drawings, block diagrams, and packaging outlines. Extracted text is segmented and tagged with position and context metadata. A layout-analysis module identifies bounding boxes for mechanical drawings and dimension callouts. This enables the AI model to correlate text-based specifications with graphical data.

In some embodiments, the OCR engine 200 uses a multi-stage decoding pipeline:

A CNN stage identifies candidate character regions.

A transformer stage performs sequence recognition.

A post-processing stage resolves engineering notation (for example, 1.52 mm, 0.060 in, or 2.65 g).

OCR results are stored as extracted OCR signals that are fed into the neural-network model 202.

Neural-Network Parameter Extraction Models

Transformer-Based Model

Figure 2:
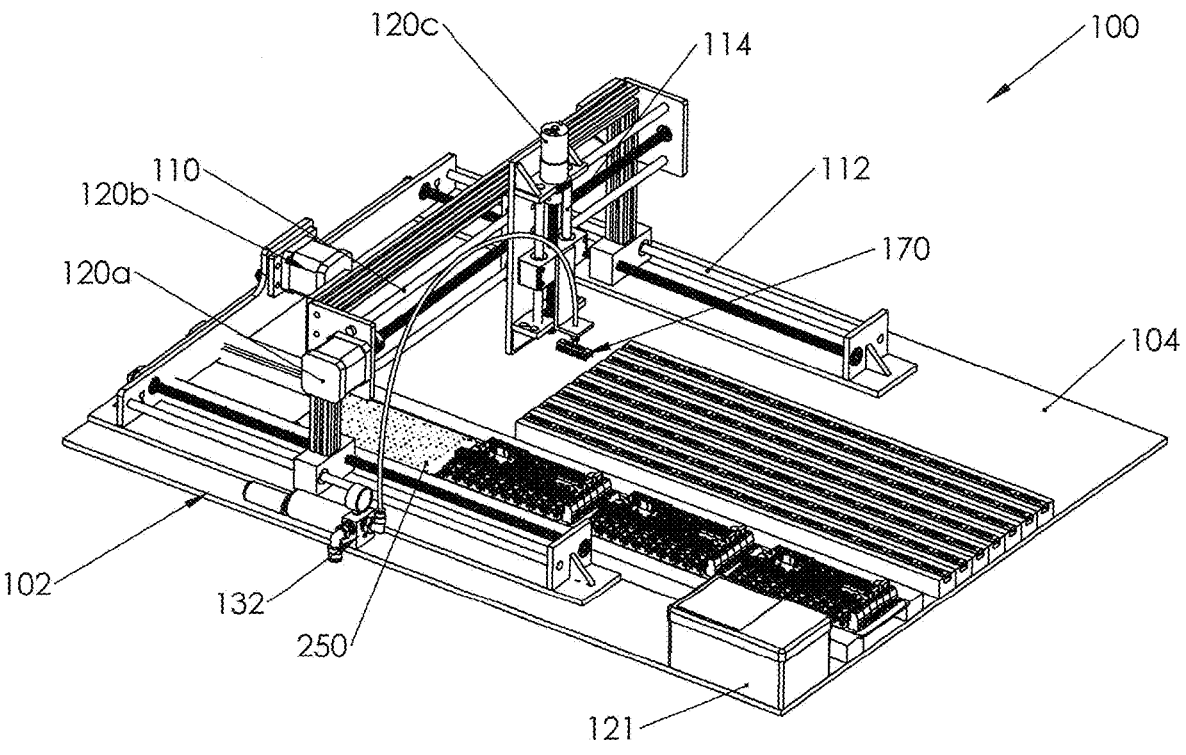
FIG. 2 is another perspective view of the pick and place machine as an FIG. 1, illustrated from another angle.

Central to validated parameter extraction 191 is the neural-network model 202, shown in FIG. 2, implemented on AI engine 184. In one embodiment, model 202 comprises a transformer-based architecture including multi-head self-attention modules, positional encoding, token embeddings, and feed-forward layers. The transformer model is pre-trained on a large corpus of technical documentation and fine-tuned on electronic component datasheets.

The model receives pre-processed text tokens and generates predicted component parameters via attention-based correlation of technical descriptions, specification tables, and dimensional statements. The self-attention layers enable the model to link related information across a datasheet, for example associating a dimension table in one section with a mechanical drawing in another.

The transformer model produces validated component height 210, validated component weight 212, validated length 214, validated width 216, packaging style, tolerance classifications, and mass distribution characteristics.

Convolutional Neural Network for Mechanical Drawings

In some implementations, model 202 includes a CNN-based sub-model optimized for interpreting mechanical drawings, package outlines, and dimension callouts. The CNN model analyzes images (300) from datasheet 192 to detect arrows, dimension lines, tolerance indicators, and reference edges. The CNN may output geometric bounding boxes and numerical dimension values with confidence scores. These values are fused with transformer-extracted parameters via a feature-fusion module.

Feature Fusion and Confidence Scoring

A fusion engine combines text-extracted and image-extracted parameters into a unified parameter set. Each parameter is associated with a confidence score derived from neural activation outputs. When a parameter extracted from text conflicts with a parameter extracted from a drawing, a conflict-resolution module selects the parameter with the higher confidence score or flags the component for operator review.

Model Training

The neural-network models may be trained using:

Supervised training on labeled datasheets containing known height and weight values.

Semi-supervised training using partially labeled datasets and self-training loops.

Data augmentation including synthetic datasheet generation with randomized typographic layouts.

Training datasets may include tens of thousands of manufacturer datasheets representing resistors, capacitors, inductors, ICs, connectors, mechanical components, and power-handling devices.

Parameter Comparison and Validation Logic

The validation comparator 220, shown in FIG. 2, receives validated component parameters 210-216 and compares them to component parameters 161 in job file 162 stored in memory 160. The comparator 220 generates deviation signals 224 representing numerical differences. The deviation signals include magnitude, direction, and parameter type identifiers.

If the deviation exceeds a threshold, the system controller 150 may update job file 162 or generate operator-notification signals 226 displayed on graphical user interface 230. Operator-notification signals may include color-coded deviation levels, parameter-specific warnings, and contextual explanations.

The comparator supports a tolerance-based validation mode. For example, if the job file specifies height 1.50 mm but the validated height is 1.52 mm, the system may consider this acceptable if it falls within a ±0.05 mm threshold. The thresholds may be user-configured per component class.

Integration with Motion Gantry Control System

Figure 3A:
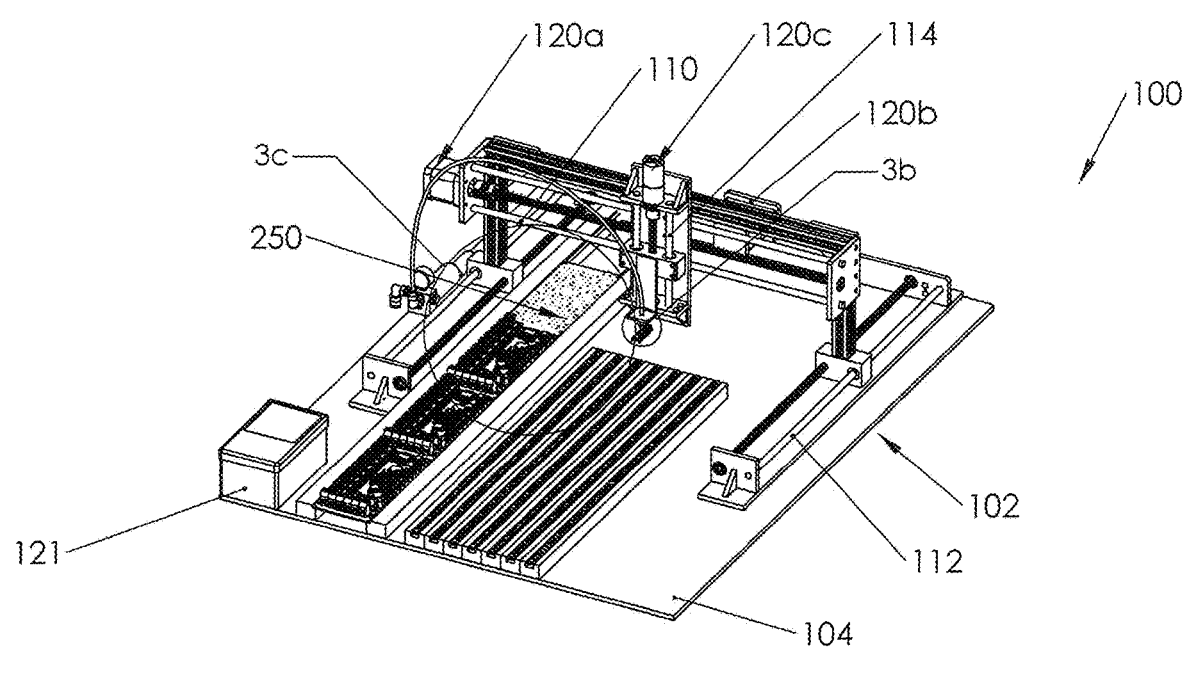
FIG. 3a is another perspective view of the pick and place machine as in FIG. 1.
Figure 3B:
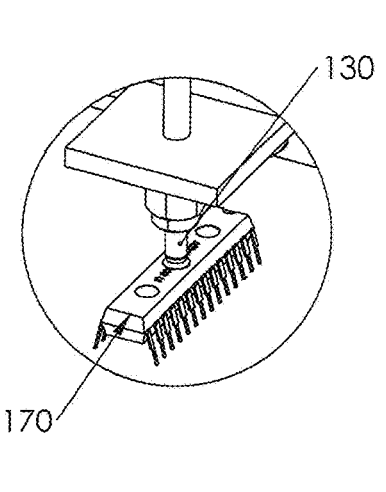
Figure 3C:
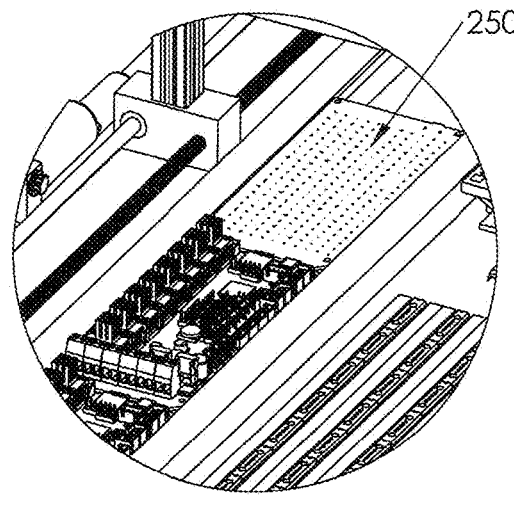
FIG. 3c is another perspective view of the pick and place machine as in FIG. 1.

Referring to FIG. 3, the validated parameters are transmitted to system controller 150, which generates motor command signals for X gantry 110, Y gantry 112, and Z gantry 114. The Z-axis motor command signals 240 control downward travel distance, velocity, acceleration, and deceleration profiles. The validated height 210 allows the controller to determine the exact stop location to ensure the component 170 contacts PCB surface 250 with controlled pressure.

The X and Y gantry motor command signals control lateral movement. For a heavier component with validated weight 212, the controller reduces acceleration to prevent slippage on placement nozzle 130. For lightweight components, the controller may increase acceleration to improve throughput.

Vacuum control signals generated by controller 150 adjust vacuum generator 132 based on component weight 212. A heavier component may require stronger vacuum force or earlier vacuum activation during pick-up. Vacuum pressure sensor 134 provides feedback to validate whether the component is securely attached before transport begins.

In one embodiment, the system uses a predictive motion-planning algorithm that incorporates validated component weight into trajectory computations. The algorithm ensures smooth acceleration transitions to prevent torque impulses that could dislodge the component.

Sequential Method Operation

Referring to FIG. 4, a method begins with loading job file 162 containing human-transcribed component parameters. The network transceiver 190 retrieves manufacturer datasheets 192. The processor assembly 180 preprocesses the datasheets and applies OCR engine 200 to produce text and image signals. Neural-network model 202 extracts validated parameters 210-216.

Validation comparator 220 computes deviation signals 224. Controller 150 updates job file 162 or generates operator-prompt signals. Finally, the pick-and-place machine 100 uses validated parameters 210-216 to generate precise motor command signals for all three gantries and vacuum control signals for placement nozzle 130.

This process ensures that each component placement is performed using parameters directly validated against the authoritative manufacturer datasheet, thereby eliminating placement errors caused by human transcription inaccuracies.

Ultimately, the validated placement data related to a respective job file, PCB, or other placement application is valuable and, preferably, is stored in a non-volatile memory associated therewith so that the verified and validated data may be used on behalf of future customers without "re-creating the wheel" so to speak It is understood that while certain forms of this invention have been illustrated and described, it is not limited thereto except insofar as such limitations are included in the following claims and allowable functional equivalents thereof.

The invention claimed is:

1. A component-placement validation system integrated into a pick-and-place (PNP) machine configured to place electronic components onto a printed circuit board (PCB), the system comprising:

a plurality of motor-driven gantries including an X gantry, a Y gantry, and a Z gantry, each gantry having a motor controller configured to receive motion command signals;

a placement nozzle coupled to the Z gantry and configured to receive vacuum control signals to hold and release electronic components;

a memory storing a machine-readable job file defining placement coordinates for a plurality of electronic components and defining associated component parameters comprising at least component height and component weight;

a network transceiver configured to transmit request signals to one or more remote datasheet repositories and to receive electronic manufacturer datasheets in response to the request signals;

a processor assembly comprising a central processing unit (CPU) and at least one hardware-accelerated artificial-intelligence (AI) engine selected from the group consisting of a graphics processing unit (GPU), a tensor-processing unit (TPU), and a neural-processing unit (NPU);

wherein the processor assembly is configured to execute machine-readable instructions stored in the memory to:

receive the job file as an electronic signal set;

parse an electronic manufacturer datasheet received through the network transceiver;

apply a neural-network model executed on the AI engine to the parsed datasheet to generate validated component parameters comprising at least a validated height and a validated weight;

generate comparison signals representing differences between the validated component parameters and the component parameters stored in the job file; and a system controller configured to receive the comparison signals and, in response to detecting a deviation above a threshold magnitude, perform at least one of:

(i) writing updated component parameters into the job file stored in the memory; and (ii) generating operator-notification signals prompting acceptance or rejection of the update;

wherein the system controller is further configured to:

generate Z-axis motor command signals based on the validated height to control downward movement and deceleration of the Z gantry when placing an electronic component; and generate at least one of X-axis and Y-axis motor command signals based on the validated weight to control lateral transport speed to prevent component slippage or detachment from the placement nozzle during movement.

2. The system of claim 1, wherein the neural-network model comprises a transformer-based architecture trained to extract numerical dimensional and mass values from structured and unstructured datasheet text.

3. The system of claim 1, wherein the processor assembly includes an optical character recognition (OCR) accelerator configured to convert embedded datasheet images into digital text signals for AI analysis.

4. The system of claim 1, wherein the network transceiver communicates with datasheet repositories through API protocols configured to support machine-to-machine data exchange.

5. The system of claim 1, wherein the system controller halts generation of motor command signals when a deviation exceeds a maximum allowable threshold.

6. The system of claim 1, wherein the placement nozzle includes a vacuum pressure sensor generating real-time feedback signals used to prevent release of an electronic component above the PCB.

7. The system of claim 1, further comprising a graphical display interface configured to output the comparison signals and highlight deviating parameters for operator review.

8. The system of claim 1, wherein the validated component parameters further comprise validated length and validated width extracted by the neural-network model.

9. The system of claim 1, wherein the AI engine executes a convolutional neural network (CNN) to analyze graphical drawings within the manufacturer datasheet to derive physical component dimensions.

10. The system of claim 1, wherein the system controller writes an updated job file to a production directory in the memory prior to initiating a subsequent PCB manufacturing cycle.

11. A method of validating electronic component parameters for operating a pick-and-place (PNP) machine having X, Y, and Z gantries, each gantry including a motor controller configured to receive motion command signals, the method comprising:

receiving, by a processor assembly comprising a CPU and a hardware-accelerated AI engine, a job file stored in an electronic memory, the job file including component parameters for a plurality of components;

transmitting, through a network transceiver, request signals to external component-datasheet repositories;

receiving, through the network transceiver, electronic manufacturer datasheets corresponding to each component;

processing, by the AI engine, text and image signals derived from each manufacturer datasheet using a neural-network model to generate validated component parameters comprising at least a validated height and a validated weight;

comparing, by the processor assembly, the validated component parameters to the component parameters from the job file to produce comparison signals representing deviations;

when the deviations exceed a threshold value, performing at least one of:

(i) automatically updating the job file in the memory using the validated component parameters; and (ii) generating operator-prompt signals for approval of the validated component parameters;

generating, by a system controller, Z-axis motor command signals based on the validated height to control downward motion and deceleration of the Z gantry during component placement; and generating, by the system controller, at least one of X-axis and Y-axis motor command signals based on the validated weight to control transport speed to prevent component slippage from a placement nozzle.

12. The method of claim 11, further comprising generating vacuum-control signals for the placement nozzle based on the validated component weight.

13. The method of claim 11, further comprising halting PCB manufacturing initiation when comparison signals exceed a preset deviation threshold.

14. The method of claim 11, wherein the neural-network model comprises a transformer-based model trained using supervised learning on historical datasheet data.

15. The method of claim 11, further comprising generating OCR signals to convert graphical datasheet images into text for AI extraction.

16. The method of claim 11, further comprising writing an updated job file to a production directory for subsequent PCB build cycles.

17. The method of claim 11, further comprising adjusting vacuum-release timing based on the validated component height.

18. The method of claim 11, wherein the validated component parameters further comprise validated length and validated width.

19. The method of claim 11, wherein the validated component parameters reduce physical placement defects including tombstoning, misalignment, component slippage, and nozzle detachment.

\* \* \* \* \*